(12) United States Patent
Shiah et al.

(10) Patent No.: US 8,536,903 B2
(45) Date of Patent: Sep. 17, 2013

(54) OUTPUT STAGE CIRCUIT FOR OUTPUTTING A DRIVING CURRENT VARYING WITH A PROCESS

(75) Inventors: Chun Shiah, Hsinchu (TW); Hao-Jan Yang, Yunlin County (TW); Ching-Ying Hsu, Hsinchu County (TW)

(73) Assignee: Etron Technology, Inc., Hsinchu (TW)

( * ) Notice: Subject to any disclaimer, the term of this patent is extended or adjusted under 35 U.S.C. 154(b) by 129 days.

(21) Appl. No.: 13/099,380

(22) Filed: May 3, 2011

(65) Prior Publication Data

US 2012/0229174 A1  Sep. 13, 2012

(30) Foreign Application Priority Data

Mar. 8, 2011  (TW) .............................. 100107685 A

(51) Int. Cl.
 *H03B 19/06* (2006.01)
(52) U.S. Cl.
 USPC .......................................... 327/108; 327/112
(58) Field of Classification Search
 USPC .............. 327/108, 112; 326/82, 83
 See application file for complete search history.

(56) References Cited

U.S. PATENT DOCUMENTS 6,064,230 A * 5/2000 Singh ............................. 326/83
7,956,653 B1 * 6/2011 Choy et al. .................... 327/108

FOREIGN PATENT DOCUMENTS

CN            1211108 A       3/1999

* cited by examiner

*Primary Examiner* — Lincoln Donovan
*Assistant Examiner* — Diana J Cheng
(74) *Attorney, Agent, or Firm* — Winston Hsu; Scott Margo

(57) ABSTRACT

An output stage circuit includes a first P-type metal-oxide-semiconductor transistor, a second P-type metal-oxide-semiconductor transistor, an N-type metal-oxide-semiconductor transistor, and a current source. A voltage of a third terminal of the first P-type metal-oxide-semiconductor transistor is a first voltage minus a voltage drop between a first terminal and a second terminal of the first P-type metal-oxide-semiconductor transistor. The N-type metal-oxide-semiconductor transistor is coupled between the third terminal of the first P-type metal-oxide-semiconductor transistor and the current source. A second terminal of the second P-type metal-oxide-semiconductor transistor is coupled to the third terminal of the first P-type metal-oxide-semiconductor transistor. When a second terminal of the N-type metal-oxide-semiconductor transistor receives a kick signal, a driving current flowing through the second P-type metal-oxide-semiconductor transistor is relevant to the voltage of the third terminal of the first P-type metal-oxide-semiconductor transistor.

12 Claims, 5 Drawing Sheets

OUTPUT STAGE CIRCUIT FOR OUTPUTTING A DRIVING CURRENT VARYING WITH A PROCESS

BACKGROUND OF THE INVENTION

1. Field of the Invention

The present invention is related to an output stage circuit, and particularly to an output stage circuit for outputting a driving current that varies with a process.

2. Description of the Prior Art

Please refer to FIG. 1. FIG. 1 is a diagram illustrating an output stage circuit 100 according to the prior art. The output stage circuit 100 includes an N-type metal-oxide-semiconductor transistor 102 and a P-type metal-oxide-semiconductor transistor 104. The N-type metal-oxide-semiconductor transistor 102 has a drain terminal coupled to a last stage circuit 103, a gate terminal for receiving a kick signal kick, and a source terminal coupled to ground GND. The P-type metal-oxide-semiconductor transistor 104 has a source terminal for receiving a first voltage VDD, a gate terminal coupled to the drain terminal of the N-type metal-oxide-semiconductor transistor 102, and a drain terminal coupled to a feedback circuit and/or a load 106 for outputting an output voltage Vx.

When the kick signal kick is enabled, the N-type metal-oxide-semiconductor transistor 102 is turned on, so that a voltage of the drain terminal of the N-type metal-oxide-semiconductor transistor 102 is pulled down to the ground GND. Meanwhile, because a voltage of the gate terminal of the P-type metal-oxide-semiconductor transistor 104 (the voltage of the drain terminal of the N-type metal-oxide-semiconductor transistor 102) is pulled down to the ground GND, the P-type metal-oxide-semiconductor transistor 104 is turned on, resulting in the output voltage Vx being pulled up and a driving current I flowing through the feedback circuit and/or the load 106.

Because the voltage of the gate terminal of the P-type metal-oxide-semiconductor transistor 104 is pulled down to the ground GND, the voltage of the gate terminal of the P-type metal-oxide-semiconductor transistor 104 can not vary with a process of the P-type metal-oxide-semiconductor transistor 104. The driving current I is determined by equation (1):

$$I = \frac{1}{2} \times kp \times \frac{W}{L}(V_{SG} - Vt)^2 \quad (1)$$

As shown in the equation (1), kp is a constant value, W is width of the P-type metal-oxide-semiconductor transistor 104, L is channel length of the P-type metal-oxide-semiconductor transistor 104, $V_{SG}$ is a voltage drop between the source terminal and gate terminal of the P-type metal-oxide-semiconductor transistor 104, and $V_t$ is a threshold voltage of the P-type metal-oxide-semiconductor transistor 104. As shown in the equation (1), kp, W, L, and $V_{SG}$ are known, so the driving current I is a constant value. Thus, the driving current I not varying with the process of the P-type metal-oxide-semiconductor transistor 104 may damage the feedback circuit and/or the load 106.

SUMMARY OF THE INVENTION

An embodiment provides an output stage circuit for outputting a driving current varying with a process. The output stage circuit includes a first P-type metal-oxide-semiconductor transistor, a second P-type metal-oxide-semiconductor transistor, an N-type metal-oxide-semiconductor transistor, and a current source. The first P-type metal-oxide-semiconductor transistor has a first terminal for receiving a first voltage, a second terminal, and a third terminal coupled to the second terminal, wherein a voltage of the third terminal is the first voltage minus a f voltage drop between the first terminal and the second terminal of the first P-type metal-oxide-semiconductor transistor. The second P-type metal-oxide-semiconductor transistor has a first terminal for receiving the first voltage, a second terminal coupled to the third terminal of the first P-type metal-oxide-semiconductor transistor, and a third terminal for outputting an output voltage. The N-type metal-oxide-semiconductor transistor has a first terminal coupled to the third terminal of the first P-type metal-oxide-semiconductor transistor, a second terminal for receiving a kick signal, and a third terminal. The current source is coupled between the third terminal of the N-type metal-oxide-semiconductor transistor and ground for providing a constant current.

Another embodiment provides an output stage circuit for outputting a driving current varying with a process. The output stage circuit includes an N-type metal-oxide-semiconductor transistor, a first P-type metal-oxide-semiconductor transistor, a second P-type metal-oxide-semiconductor transistor, and a current source. The N-type metal-oxide-semiconductor transistor has a first terminal for receiving a first voltage, a second terminal coupled to the first terminal, and a third terminal, where a voltage of the third terminal is the first voltage minus a voltage drop between the second terminal and the third terminal of the N-type metal-oxide-semiconductor transistor. The first P-type metal-oxide-semiconductor transistor has a first terminal for receiving the first voltage, a second terminal coupled to the third terminal of the N-type metal-oxide-semiconductor transistor, and a third terminal for outputting an output voltage. The second P-type metal-oxide-semiconductor transistor has a first terminal coupled to the third terminal of the N-type metal-oxide-semiconductor transistor, a second terminal for receiving a kick signal, and a third terminal. The current source is coupled between the third terminal of the second P-type metal-oxide-semiconductor transistor and ground for providing a constant current.

The present invention provides an output stage circuit for outputting a driving current varying with a process utilizes a diode-connected P-type metal-oxide-semiconductor transistor or a diode-connected N-type metal-oxide-semiconductor transistor to couple to a gate terminal of a metal-oxide-semiconductor transistor (a P-type metal-oxide-semiconductor transistor or an N-type metal-oxide-semiconductor transistor) for outputting an output voltage. Therefore, a voltage of the gate terminal of the metal-oxide-semiconductor transistor for outputting the output voltage varies with processes of the diode-connected P-type metal-oxide-semiconductor transistor or the diode-connected N-type metal-oxide-semiconductor transistor, instead of being a constant value. Thus, in the output stage circuit, a driving current flowing through the metal-oxide-semiconductor transistor for outputting the output voltage is also not a constant value and the driving current varies with the processes of the diode-connected P-type metal-oxide-semiconductor transistor or the diode-connected N-type metal-oxide-semiconductor transistor, so the driving current cannot damage another circuit coupled to the metal-oxide-semiconductor transistor for outputting the output voltage.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
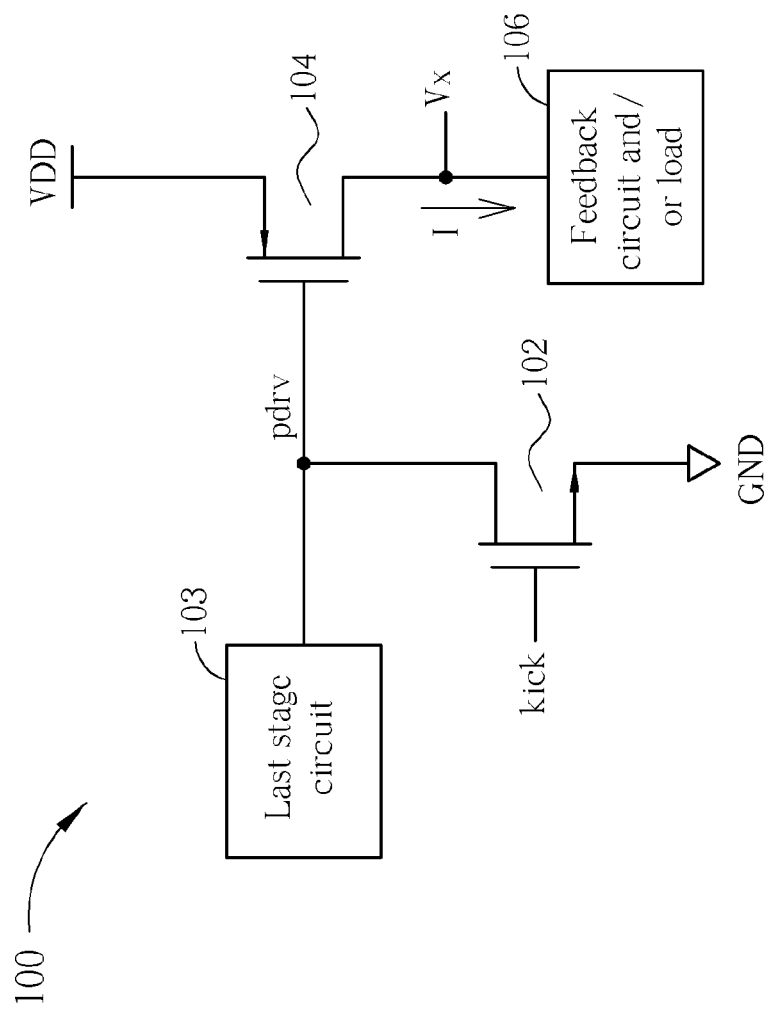
FIG. 1 is a diagram illustrating an output stage circuit according to the prior art.
Figure 2:
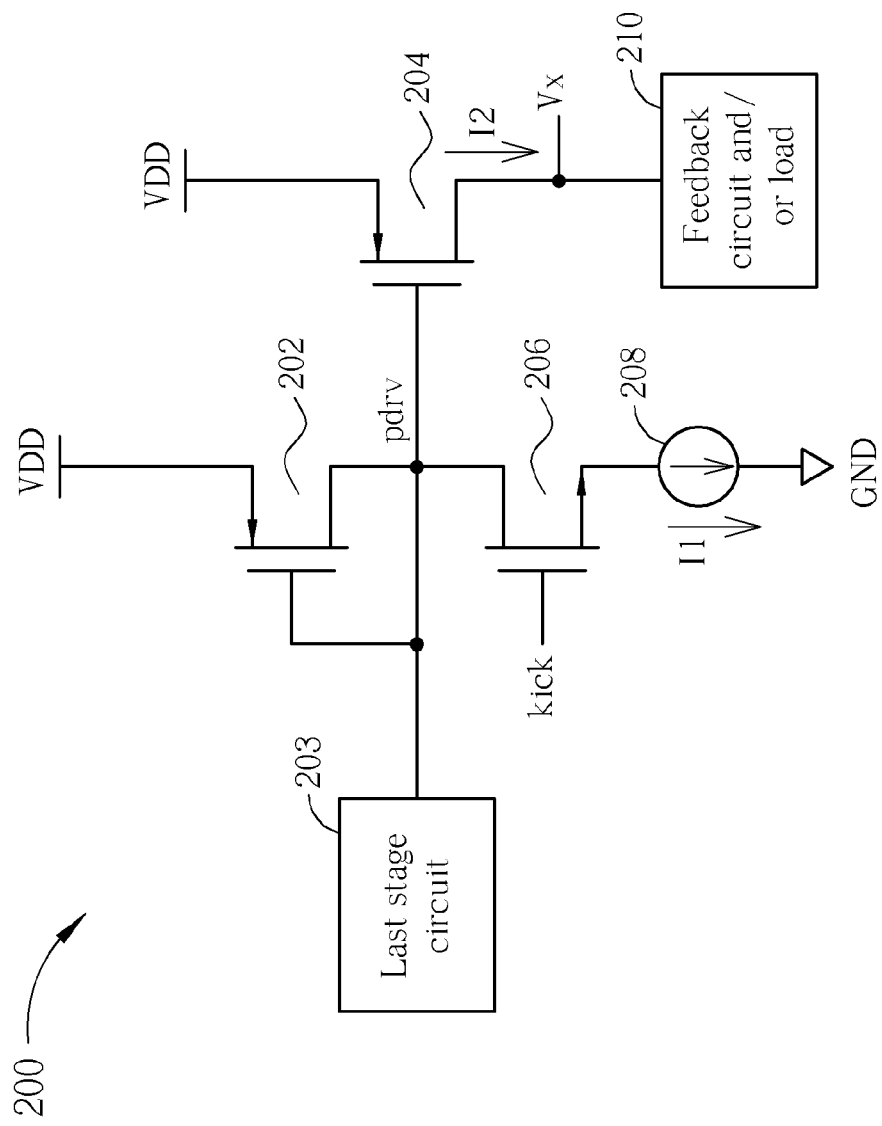
FIG. 2 is a diagram illustrating an output stage circuit for outputting a driving current varying with a process according to an embodiment.

Please refer to FIG. 2. FIG. 2 is a diagram illustrating an output stage circuit 200 for outputting a driving current varying with a process according to an embodiment. The output stage circuit 200 includes a first P-type metal-oxide-semiconductor transistor 202, a second P-type metal-oxide-semiconductor transistor 204, an N-type metal-oxide-semiconductor transistor 206, and a current source 208. The first P-type metal-oxide-semiconductor transistor 202 has a first terminal (source terminal) for receiving a first voltage VDD, a second terminal (gate terminal) coupled to a last stage circuit 203, and a third terminal (drain terminal) pdrv coupled to the gate terminal. The second P-type metal-oxide-semiconductor transistor 204 has a first terminal (source terminal) for receiving the first voltage VDD, a second terminal (gate terminal) coupled to the drain terminal pdrv of the first P-type metal-oxide-semiconductor transistor 202, and a third terminal (drain terminal) coupled to a feedback circuit and/or a load 210 for outputting an output voltage Vx. The N-type metal-oxide-semiconductor transistor 206 has a first terminal (drain terminal) coupled to the drain terminal pdrv of the first P-type metal-oxide-semiconductor transistor 202, a second terminal (gate terminal) for receiving a kick signal kick, and a third terminal (source terminal). The current source 208 is coupled between the source terminal of the N-type metal-oxide-semiconductor transistor 206 and ground GND for providing a constant current I1. Channel length of the first P-type metal-oxide-semiconductor transistor 202 is equal to channel length of the second P-type metal-oxide-semiconductor transistor 204. When the N-type metal-oxide-semiconductor transistor 206 is turned on according to the kick signal kick, a voltage Vpdrv of the drain terminal pdrv of the first P-type metal-oxide-semiconductor transistor 202 is determined by equation (2):

$$Vpdrv = VDD - V_{SG1} \quad (2)$$

In the equation (2), $V_{SG1}$ is a voltage drop between the source terminal and gate terminal of the first P-type metal-oxide-semiconductor transistor 202.

In addition, a voltage drop $V_{SG2}$ between the source terminal and gate terminal of the second P-type metal-oxide-semiconductor transistor 204 is determined by equation (3):

$$\begin{aligned} V_{SG2} &= VDD - Vpdrv \\ &= VDD - (VDD - V_{SG1}) \\ &= V_{SG1} \end{aligned} \quad (3)$$

As shown in the equation (3), the voltage drop $V_{SG2}$ between the source terminal and gate terminal of the second P-type metal-oxide-semiconductor transistor 204 is equal to the voltage drop $V_{SG1}$ between the source terminal and gate terminal of the first P-type metal-oxide-semiconductor transistor 202. Because the channel length of the first P-type metal-oxide-semiconductor transistor 202 is equal to the channel length of the second P-type metal-oxide-semiconductor transistor 204, a driving current I2 flowing through the second P-type metal-oxide-semiconductor transistor 204 corresponds to the voltage drop $V_{SG1}$ between the first terminal and the second terminal of the first P-type metal-oxide-semiconductor transistor 202 according to the equation (1). Therefore, the driving current I2 varies with processes of the first P-type metal-oxide-semiconductor transistor 202 and the second P-type metal-oxide-semiconductor transistor 204, instead of a constant value.

Figure 3:
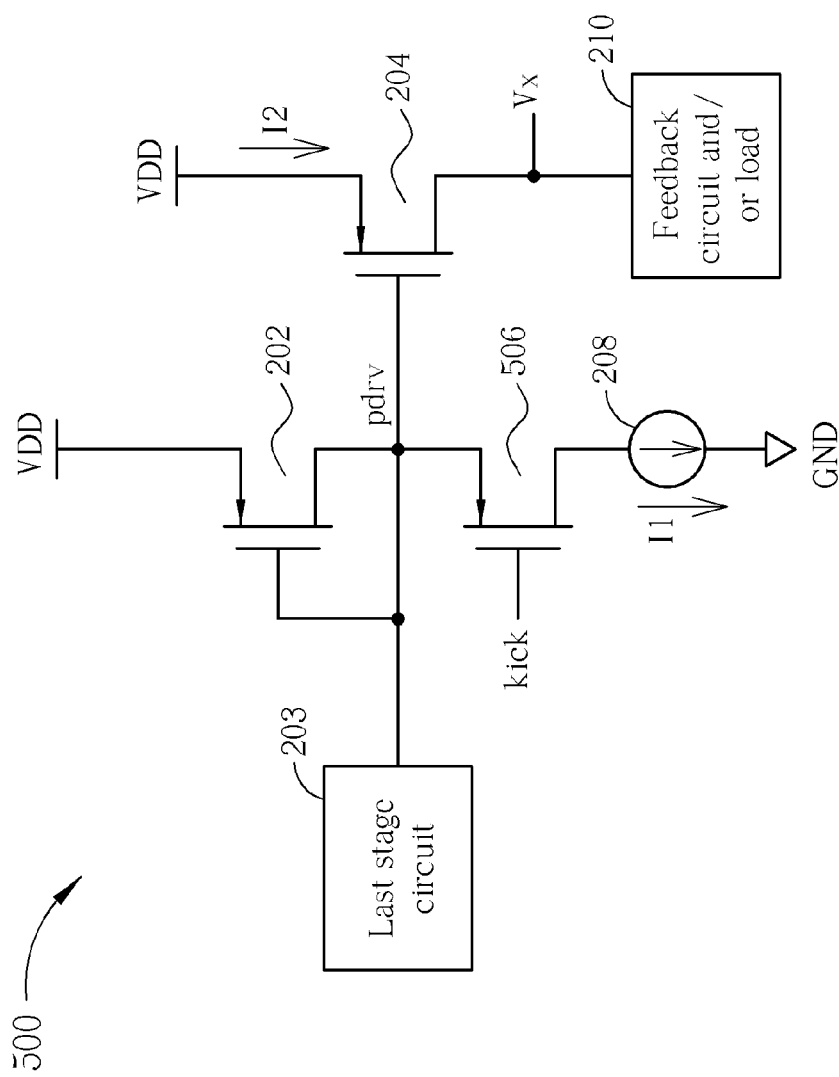
FIG. 3 is a diagram illustrating an output stage circuit for outputting a driving current varying with a process according to another embodiment.

Please refer to FIG. 3. FIG. 3 is a diagram illustrating an output stage circuit 500 for outputting a driving current varying with a process according to another embodiment. A difference between the output stage circuit 500 and the output stage circuit 200 is that the output stage circuit 500 substitutes a third P-type metal-oxide-semiconductor transistor 506 for the N-type metal-oxide-semiconductor transistor 206 of the output stage circuit 200. Further, subsequent operational principles of the output stage circuit 500 are the same as those of the output stage circuit 200, so further description thereof is omitted for simplicity.

Figure 4:
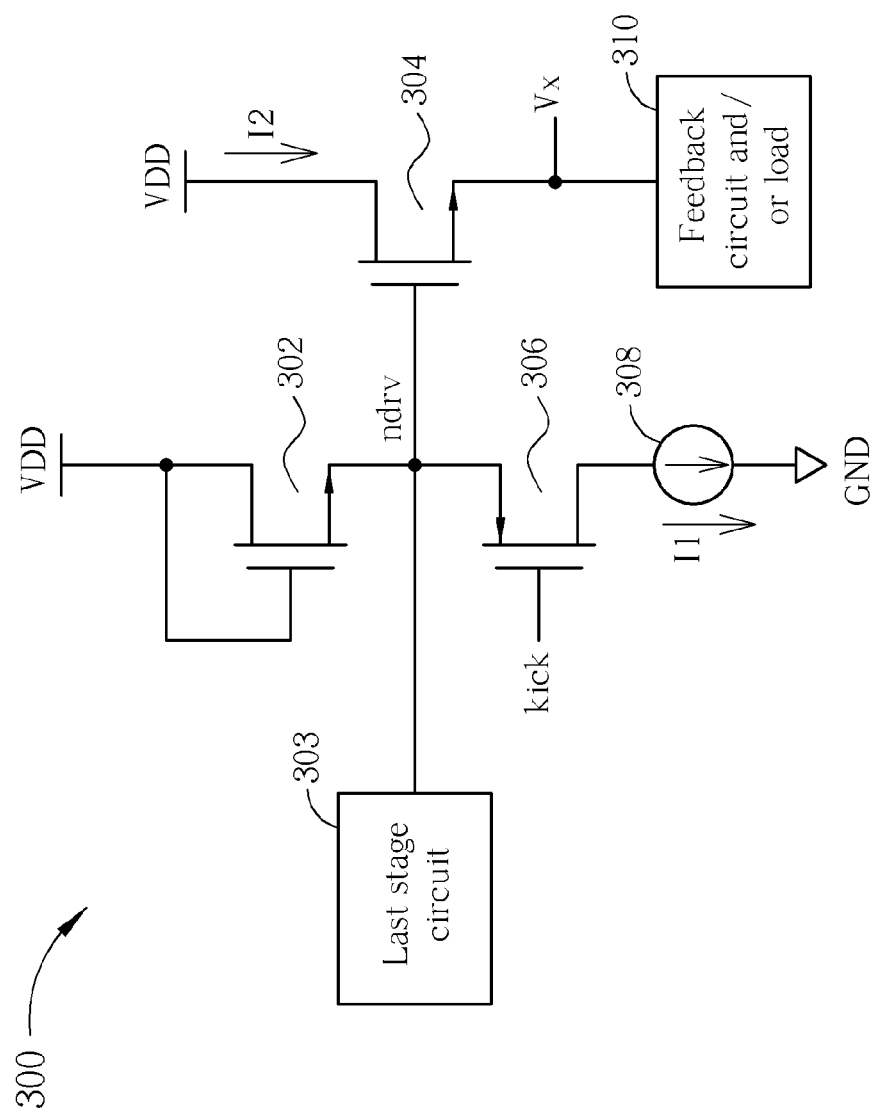
FIG. 4 is a diagram illustrating an output stage circuit for outputting a driving current varying with a process according to another embodiment.

Please refer to FIG. 4. FIG. 4 is a diagram illustrating an output stage circuit 300 for outputting a driving current varying with a process according to another embodiment. The output stage circuit 300 includes an N-type metal-oxide-semiconductor transistor 302, a first N-type metal-oxide-semiconductor transistor 304, a second P-type metal-oxide-semiconductor transistor 306, and a current source 308. The N-type metal-oxide-semiconductor transistor 302 has a first terminal (drain terminal) for receiving a first voltage VDD, a second terminal (gate terminal) coupled to the drain terminal, and a third terminal (source terminal) ndrv coupled to a last stage circuit 303. The first N-type metal-oxide-semiconductor transistor 304 has a first terminal (drain terminal) for receiving the first voltage VDD, a second terminal (gate terminal) coupled to the source terminal ndrv of the N-type metal-oxide-semiconductor transistor 302, and a third terminal (source terminal) coupled to a feedback circuit and/or a load 310 for outputting an output voltage Vx. The second P-type metal-oxide-semiconductor transistor 306 has a first terminal (source terminal) coupled to the source terminal ndrv of the N-type metal-oxide-semiconductor transistor 302, a second terminal (gate terminal) for receiving a kick signal kick, and a third terminal (drain terminal). The current source 308 is coupled between the drain terminal of the second P-type metal-oxide-semiconductor transistor 306 and ground GND for providing a constant current I1. Channel length of the N-type metal-oxide-semiconductor transistor 302 is equal to channel length of the first N-type metal-oxide-semiconductor transistor 304. When the second P-type metal-oxide-semiconductor transistor 306 is turned on according to the kick signal kick, a voltage Vndrv of the source terminal ndrv of the N-type metal-oxide-semiconductor transistor 302 is determined by equation (4):

$$Vndrv = VDD - V_{GS1} \quad (4)$$

In the equation (4), $V_{GS1}$ is a voltage drop between the gate terminal and source terminal of the N-type metal-oxide-semiconductor transistor 302, where $V_{GS1}$ varies with a process of the N-type metal-oxide-semiconductor transistor 302.

In addition, a voltage of the gate terminal of the first N-type metal-oxide-semiconductor transistor 304 is equal to the voltage Vndrv of the source terminal ndrv of the N-type metal-oxide-semiconductor transistor 302, and the channel length of the N-type metal-oxide-semiconductor transistor 302 is equal to the channel length of the first N-type metal-oxide-semiconductor transistor 304, so a voltage drop between the gate terminal and source terminal of the first N-type metal-oxide-semiconductor transistor 304 corresponds to the voltage Vndrv of the source terminal ndrv of the N-type metal-oxide-semiconductor transistor 302. Thus, a driving current I2 flowing through the first N-type metal-oxide-semiconductor transistor 304 varies with processes of the N-type metal-oxide-semiconductor transistor 302 and the first N-type metal-oxide-semiconductor transistor 304, instead of being a constant value according to the equation (1).

Figure 5:
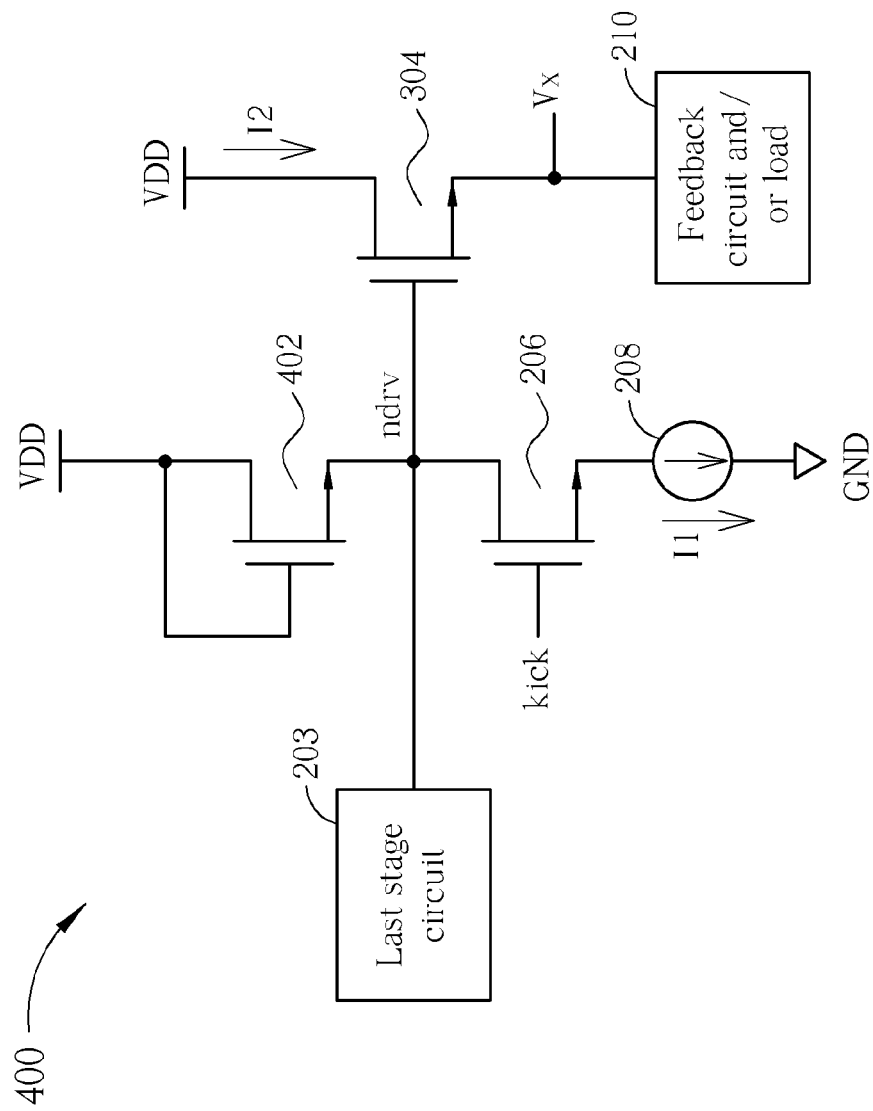
FIG. 5 is a diagram illustrating an output stage circuit for outputting a driving current varying with a process according to another embodiment.

Please refer to FIG. 5. FIG. 5 is a diagram illustrating an output stage circuit 400 for outputting a driving current varying with a process according to another embodiment. A difference between the output stage circuit 400 and the output stage circuit 300 is that the output stage circuit 400 substitutes the N-type metal-oxide-semiconductor transistor 206 for the second P-type metal-oxide-semiconductor transistor 306 of the output stage circuit 300. Further, subsequent operational principles of the output stage circuit 400 are the same as those of the output stage circuit 300, so further description thereof is omitted for simplicity.

To sum up, the output stage circuit for outputting the driving current varying with the process utilizes the diode-connected P-type metal-oxide-semiconductor transistor or the diode-connected N-type metal-oxide-semiconductor transistor to couple to the gate terminal of the metal-oxide-semiconductor transistor (the P-type metal-oxide-semiconductor transistor or the N-type metal-oxide-semiconductor transistor) for outputting the output voltage. Therefore, a voltage of the gate terminal of the metal-oxide-semiconductor transistor for outputting the output voltage varies with processes of the diode-connected P-type metal-oxide-semiconductor transistor or the diode-connected N-type metal-oxide-semiconductor transistor, instead of being a constant value. Thus, in the present invention, a driving current flowing through the metal-oxide-semiconductor transistor for outputting the output voltage is also not a constant value and varies with the processes of the diode-connected P-type metal-oxide-semiconductor transistor or the diode-connected N-type metal-oxide-semiconductor transistor, so the driving current can not damage another circuit coupled to the metal-oxide-semiconductor transistor for outputting the output voltage.

Those skilled in the art will readily observe that numerous modifications and alterations of the device and method may be made while retaining the teachings of the invention.

What is claimed is:

1. An output stage circuit for outputting a driving current varying with a process, the output stage circuit comprising:
   a first P-type metal-oxide-semiconductor transistor having a first terminal for receiving a first voltage, a second terminal, and a third terminal coupled to the second terminal, wherein a voltage of the third terminal is the first voltage minus a voltage drop between the first terminal and the second terminal of the first P-type metal-oxide-semiconductor transistor;
   a second P-type metal-oxide-semiconductor transistor having a first terminal for receiving the first voltage, a second terminal coupled to the third terminal of the first P-type metal-oxide-semiconductor transistor, and a third terminal for outputting an output voltage, wherein a voltage drop between the first terminal and the second terminal of the second P-type metal-oxide-semiconductor transistor is equal to the voltage drop between the first terminal and the second terminal of the first P-type metal-oxide-semiconductor transistor;
   an N-type metal-oxide-semiconductor transistor having a first terminal coupled to the third terminal of the first P-type metal-oxide-semiconductor transistor, a second terminal for receiving a kick signal, and a third terminal; and
   a current source coupled between the third terminal of the N-type metal-oxide-semiconductor transistor and ground for providing a constant current;
   wherein channel length of the first P-type metal-oxide-semiconductor transistor is equal to channel length of the second P-type metal-oxide-semiconductor transistor.

2. The output stage circuit of claim 1, wherein current flowing through the second P-type metal-oxide-semiconductor transistor corresponds to the voltage drop between the first terminal and the second terminal of the first P-type metal-oxide-semiconductor transistor.

3. The output stage circuit of claim 1, wherein the third terminal of the second P-type metal-oxide-semiconductor transistor is coupled to a feedback circuit and/or a load.

4. The output stage circuit of claim 1, wherein the first terminal of the first P-type metal-oxide-semiconductor transistor is a source terminal, the second terminal of the first P-type metal-oxide-semiconductor transistor is a gate terminal, and the third terminal of the first P-type metal-oxide-semiconductor transistor is a drain terminal.

5. The output stage circuit of claim 1, wherein the first terminal of the second P-type metal-oxide-semiconductor transistor is a source terminal, the second terminal of the second P-type metal-oxide-semiconductor transistor is a gate terminal, and the third terminal of the second P-type metal-oxide-semiconductor transistor is a drain terminal.

6. The output stage circuit of claim 1, wherein the first terminal of the N-type metal-oxide-semiconductor transistor is a drain terminal, the second terminal of the N-type metal-oxide-semiconductor transistor is a gate terminal, and the third terminal of the N-type metal-oxide-semiconductor transistor is a source terminal.

7. An output stage circuit for outputting a driving current varying with a process, the output stage circuit comprising:
   an N-type metal-oxide-semiconductor transistor having a first terminal for receiving a first voltage, a second terminal coupled to the first terminal, and a third terminal, wherein a voltage of the third terminal is the first voltage minus a voltage drop between the second terminal and the third terminal of the N-type metal-oxide-semiconductor transistor;
   a first N-type metal-oxide-semiconductor transistor having a first terminal for receiving the first voltage, a second terminal coupled to the third terminal of the N-type metal-oxide-semiconductor transistor, and a third terminal for outputting an output voltage, wherein a voltage drop between the second terminal and the first terminal of the first N-type metal-oxide-semiconductor transistor corresponds to a voltage of the third terminal of the N-type metal-oxide-semiconductor transistor;

a second P-type metal-oxide-semiconductor transistor having a first terminal coupled to the third terminal of the N-type metal-oxide-semiconductor transistor, a second terminal for receiving a kick signal, and a third terminal; and a current source coupled between the third terminal of the second P-type metal-oxide-semiconductor transistor and ground for providing a constant current;

wherein channel length of the N-type metal-oxide-semiconductor transistor is equal to channel length of the first N-type metal-oxide-semiconductor transistor.

8. The output stage circuit of claim 7, wherein current flowing through the first N-type metal-oxide-semiconductor transistor corresponds to the voltage drop between the second terminal and the third terminal of the N-type metal-oxide-semiconductor transistor.

9. The output stage circuit of claim 7, wherein the third terminal of the first N-type metal-oxide-semiconductor transistor is coupled to a feedback circuit and/or a load.

10. The output stage circuit of claim 7, wherein the first terminal of the N-type metal-oxide-semiconductor transistor is a drain terminal, the second terminal of the N-type metal-oxide-semiconductor transistor is a gate terminal, and the third terminal of the N-type metal-oxide-semiconductor transistor is a source terminal.

11. The output stage circuit of claim 7, wherein the first terminal of the first N-type metal-oxide-semiconductor transistor is a source terminal, the second terminal of the first N-type metal-oxide-semiconductor transistor is a gate terminal, and the third terminal of the first N-type metal-oxide-semiconductor transistor is a drain terminal.

12. The output stage circuit of claim 7, wherein the first terminal of the second P-type metal-oxide-semiconductor transistor is a source terminal, the second terminal of the second P-type metal-oxide-semiconductor transistor is a gate terminal, and the third terminal of the second P-type metal-oxide-semiconductor transistor is a drain terminal.

* * * * *